United States Patent
Lee

(10) Patent No.: US 6,400,581 B1
(45) Date of Patent: Jun. 4, 2002

(54) METHOD FOR ADAPTIVE CONTROL OF SWITCHING LOSSES IN A DRIVE CIRCUIT FOR ACTIVE ELEMENTS

(75) Inventor: Nai-Chi Lee, Briarcliff Manor, NY (US)

(73) Assignee: Koninklijke Philips Electronics N.V., Eidenhoven (NL)

( * ) Notice: Subject to any disclaimer, the term of this patent is extended or adjusted under 35 U.S.C. 154(b) by 0 days.

(21) Appl. No.: 09/835,615

(22) Filed: Apr. 16, 2001

(51) Int. Cl.[7] ............................................. H02M 3/335
(52) U.S. Cl. ................. 363/21.01; 363/21.04; 363/97
(58) Field of Search .................. 363/16, 20, 21.01, 363/21.04, 21.09, 95, 97, 131

(56) References Cited

U.S. PATENT DOCUMENTS

| | | | |
|---|---|---|---|
| 4,688,158 A | * | 8/1987 | Peterson et al. ............... 363/21 |
| 5,400,240 A | * | 3/1995 | Araki ........................... 363/97 |
| 5,936,851 A | * | 8/1999 | Hickman ....................... 363/17 |
| 6,052,268 A | | 4/2000 | Thomas ........................ 361/103 |
| 6,341,073 B1 | * | 1/2002 | Lee ........................... 363/21.02 |

* cited by examiner

Primary Examiner—Matthew Nguyen

(57) ABSTRACT

A method for reducing power losses in a semiconductor switching device in a switching power converter by continuously monitoring an instantaneous power dissipation signal in the switching device and creating an appropriate correction signal to optimize that parasitic power dissipation. A multitude of strobed current and voltage measurement signals associated with the switching device are obtained over a time period using a pair of analog-to-digital converters (ADCs). These measurement signals are used to calculate the multitude of instantaneous power signals, then to derive an average power dissipation signal for a complete cycle and create the correction signal based on a comparison with a reference signal in memory. The correction signal can be, derived in a computer via an algorithm or a look-up table, and would preferably provide a relative adjustment in the timings of the switching device.

19 Claims, 5 Drawing Sheets

US 6,400,581 B1

METHOD FOR ADAPTIVE CONTROL OF SWITCHING LOSSES IN A DRIVE CIRCUIT FOR ACTIVE ELEMENTS

FIELD OF THE INVENTION

This invention relates to the field of power switching, and more particularly to a method for automatically controlling switching power losses.

BACKGROUND OF THE INVENTION

In applications having power semiconductors devices driving reactive loads, such as MOSFETs in voltage converters, a significant source of energy loss and attendant component overheating occurs as these devices change states. Due to the inability of inductances to instantaneously change currents, an On/Off switching of the power semiconductor creates a condition where a high voltage is impressed across the semiconductor switching device simultaneously with a high current being conducted through the switching device. This results in a large power transient that is proportional to the voltage, the current, and the amount of time that the condition exists relative to a cyclic time period. Such power transients reduce system efficiency and can often be damaging to the semiconductor device if not minimized.

Conventional design approaches to alleviating this switching stress on the power semiconductor has been to implement various "soft" switching circuits, such as zero voltage switching and zero current switching, where alternative circuit devices are used to sustain inductive currents during the switching transitions until the semiconductor device voltage is minimized. Exemplary techniques can involve the incorporation of one or more reactive "snubber/slope control" resistor-capacitor (RC) circuits to provide a transition charge to a main reactive element during the time that the semiconductor is changing states. During these switching transition times, energy is stored in the snubber circuits and is dissipated as heat during the remainder of a periodic cycle so as to be ready to provide an identical function on a following cycle. This allows the semiconductor device to change states at a minimal current condition, and, thus, with a minimal transient power loss. While this shifts the energy loss away from the semiconductor device to a heartier snubber component, it does not eliminate the loss, so the energy inefficiency still exists.

An alternative approach uses L-C resonant circuits that are excited to a steady-state resonance condition, wherein signal waveform changes are generated by the L-C circuit rather than by the semiconductor device. In the steady state operation of such an application, the semiconductor device can then be switched on exclusively in a low voltage/low power condition. As before, such a configuration requires the use of fixed components that are selected on the basis of a predetermined fixed operating frequency and a maximum transient power control requirement. With such predetermined solutions, system operation and efficiency cannot be optimized for variations in input voltage or output loading.

SUMMARY

An electronic apparatus and method for reduce switching power losses in a semiconductor power switching device in voltage converters by calculating a power dissipation signal using a multitude of instantaneous voltage and current samples. This calculated power signal is compared to a reference signal that is derived from previous data samples, and a correction signal is generated to dynamically modify the drive and/or timing parameters of the power switching device. The multitude of voltage and current samples are preferably measured using an analog-to-digital converter (ADC) and accumulatively stored in memory until used by a computing device to calculate the correction signal, which is preferably an adjustment in a $T_{off}$ time for the switching devices. The constant monitoring of the power dissipation via the ADCs and continuous correction of the power dissipation optimizes the operation of the voltage converter.

DETAILED DESCRIPTION OF THE INVENTION

According to a preferred embodiment of the present invention, power dissipation in a power switching device of a voltage converter can be optimized by a continuous sampling of the voltage and current signals associated with the switching device in order to create appropriate adjustment to the drive signals of the switching device. In a conventional switching power converter, an input voltage signal is converted into one or more output voltage signals, typically at a different voltage level or levels from that of the input voltage signal. The converter typically employs one or more digital switching devices, which control a primary reactive energy storage element to implement the transformation. Converter operation over a representative time period, T, is characterized by current conduction in the switching device or devices during a $T_{on}$ portion of T, wherein energy is stored in the reactive device, followed by a current non-conduction $T_{off}$ portion of T, where the stored energy is transferred from the reactive element to a load.

Figure 1:
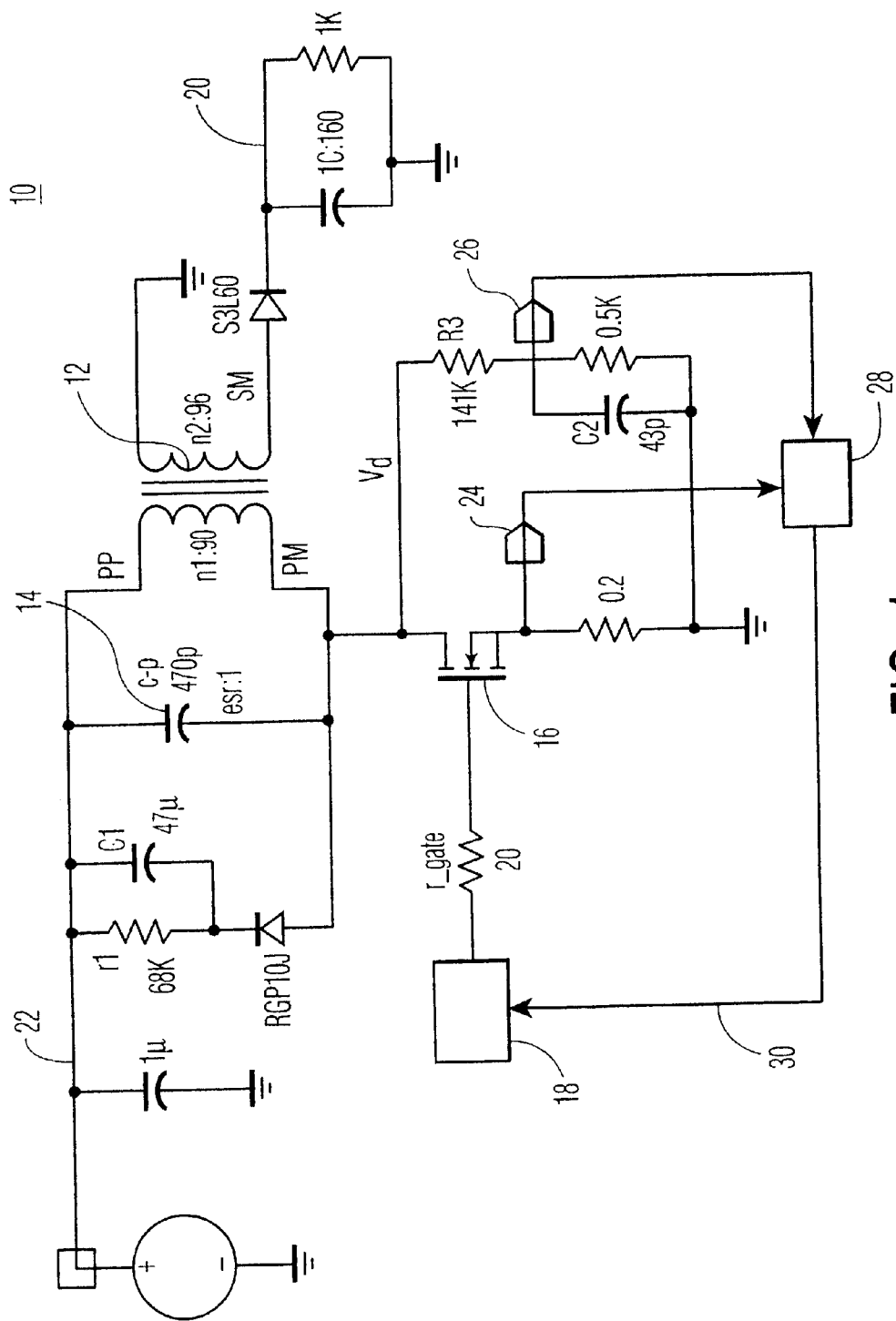
FIG. 1 shows a circuit diagram of an exemplary power converter circuit according to the present invention.

FIG. 1 shows a circuit diagram of an exemplary power converter circuit 10 according to the present invention. In a preferred embodiment, converter 10 would be of a type known as quasi-resonant converters, wherein resonance voltage swings induced by the primary inductance, $L_p$, of a transformer 12 and a resonance capacitance, $C_p$, 14 on a drive device 16 allow device 16 to be activated only when a low voltage is present across its terminals. This provides a low voltage across device 16 during On/Off transitions of a current signal through device 16, thus minimizes the switching power losses. The duration of a conduction time, $T_{on}$, is determined by a regulation device 18, and is a function of an output voltage signal on voltage rail 20 and an input voltage signal on voltage rail 22.

In a practical (i.e. non-idealized) quasi-resonant converter operation, however, drive device 16 usually has to turn "on" in a condition of non-zero voltage. This can create a power transient during both the turn-on and turn-off transition times that occur in each cycle as the voltage and current traverse to their alternate quiescent values. To calculate and adjust these power transients, a pair of sampling circuits, such as analog-to-digital converter (ADC) 24 and ADC 26, simultaneously sense a current magnitude through device 16 and a voltage magnitude across device 14 at a multitude of predetermined sample times, $T_s$. Preferably, ADCs 24 and 26 use a common strobe to transfer this multitude of digital output voltage signals to a computing device 28, which then calculates an average power dissipation value over a predetermined period.

This power metric can then be used to create a correction signal 30 that causes regulation device 18 to change in one or more drive parameter for device 16 in order to reduce the power dissipation. Correction signal 30 can take various forms, including, without limitation, adjusting the drive levels to device 14 to force faster transient switching time, or stretching $T_{off}$ to increase period time T, thus lowering the average power and heating effects of the power transients.

Creation of correction signal 30 can be implemented using various methods as are well known in the art. For example, in a preferred embodiment according to the present invention, a stored power signal value, which was calculated in a previous time period, can be compared with the newly calculated value using an algorithm. A resultant from the algorithm could cause a timing change in the operation of converter 10, such as increasing the "off" time, $t_{off}$. Alternatively, a look-up table in memory holding corrective values and/or weighting coefficients could be employed alone or in combination with an algorithm or other computational means to create correction signal 30.

It should be noted that in an exemplary converter having an operating frequency could be between 50 KHz to 200 KHz and a cyclic period, T, of 5 to 20 microseconds, a response time for creating correction signal 30 would not typically be from one cycle to the next, but rather over a longer period of time. Such a response time delay guards against closed-loop instabilities that can be caused by noise or other transient phenomena. Thus, a response time for generating correction signal 30 could preferably be in the millisecond range, a same time response as a normal voltage regulation feedback loop.

This slower response time requirement also greatly relaxes the performance requirements on computing device 28, allowing for use of inexpensive microprocessors and micro-controllers, such as devices from the 8031 and 8051 families. However, this relaxed performance requirement does not prevent the use of more powerful computing devices, such as digital signal processors, personal computers, or handheld computing devices. In alternative embodiments, computing device 28 can be replaced by a digital or analog device having power calculating capabilities or by logical arrays containing predetermined values that produce a specific result when subjected to specific current and voltage input digital values, similar to a look-up table.

Further, rather than instantaneously calculating the power, digital sample signals from ADCs 24 and 26 can be temporarily stored in memory for either delayed calculation and correction operation or for transmission to alternate controllers. In this context, memory would preferably be a semiconductor device having volatile or non-volatile memory, and could consist of dynamic or static random access memory (DRAM and SRAM, respectively.) or electronically programmable memory, such as flash and electronically erasable, programmable read-only-memory (EEPROM).

Figure 2:
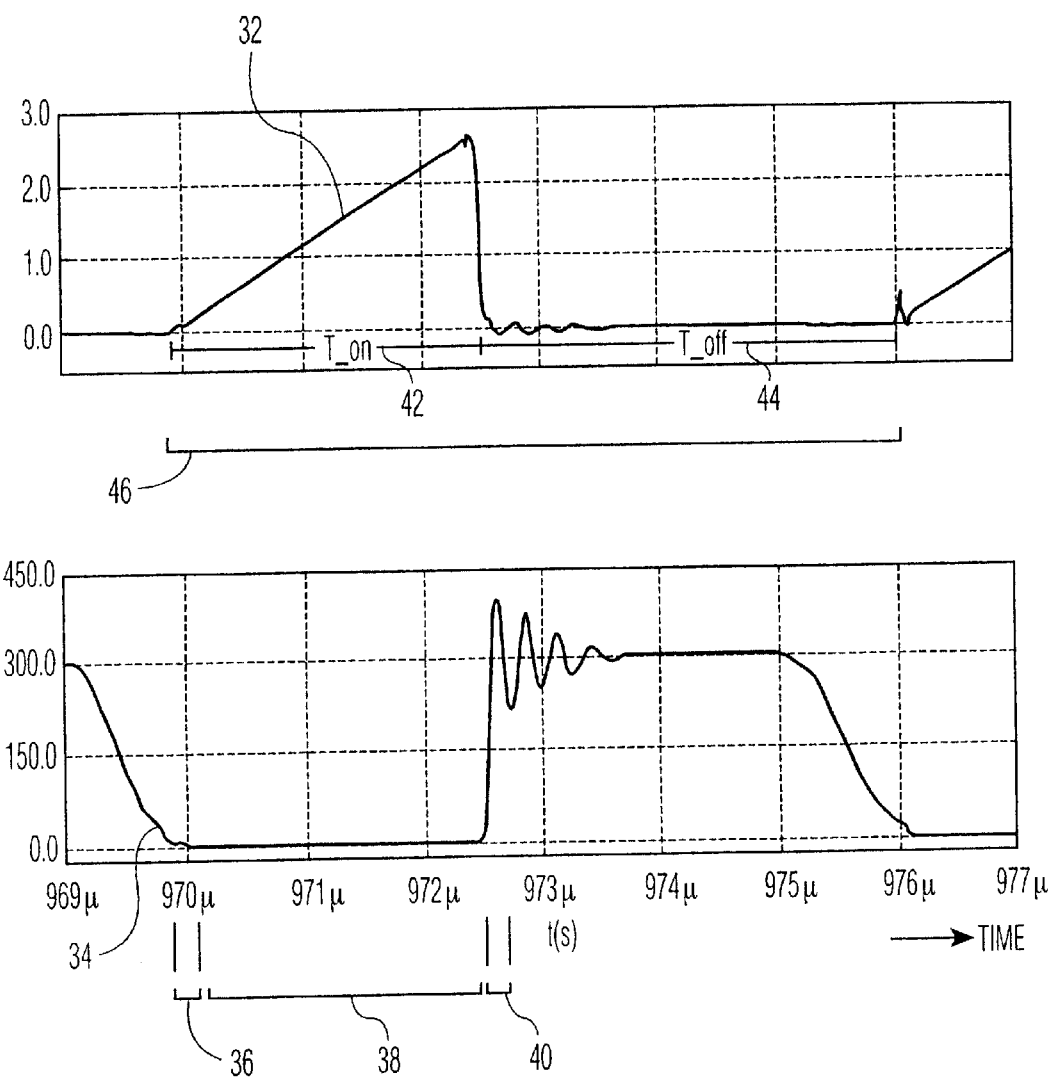
FIG. 2 shows representative voltage and current waveform signals for a quasi-resonant converter over a single cycle time period, T.

FIG. 2 shows representative current and voltage waveform signals, 32 and 34, respectively, for a quasi-resonant converter over a single cycle time period, T. At any instantaneous point in time, the instantaneous power is the product of the amplitude of the current and voltage signals 32 and 34. Cyclic energy dissipation is the area contained within an envelope of such voltage/current product calculations over time. From FIG. 2 it can be seen that a cyclic dissipative power figure can consist of three principal components: a turn-on transition component 36, an "On" component 38, and a turn-off transition component 40. On time and off time and period are labeled $T_{on}$ 42, $T_{off}$ 44, and T 46, respectively.

In the exemplary waveforms shown in FIG. 2, turn-on transient component 36 has negligible power, since the voltage signal is close to zero. During $T_{on}$ 42, voltage signal 34 across drive device 16 is very low, while the current signal 32 is ramping up. Instantaneous power during this time is similarly small, 1 volt×2 amps, or 2 watts for example. At turn-off time, however, the instantaneous power can be quite large, 200 volts×2 amps, or 400 watts, for example. The preceding quantities are exemplary only, and are not intended to be restricting.

Further, the waveform signals are also exemplary only, since different configurations produce different waveforms. For example, a power converter using a non-resonant, square wave or trapezoidal drive can have turn-on transient component 36 having significantly higher power dissipation, while turn-off transient component 40 can have negligible power dissipation. Alternative drive configurations can have equal power dissipation characteristics for transient components 36 and 40. For all of these variations, the use of a correction signal 30 according to the present invention can reduce the average power dissipation and prevent destructive heating effects associated with switching converters.

Regardless of the circuit configuration employed, the sampling and correcting circuits and methods of the present invention can be used to reduce destructive heating effects from switching and conduction losses. By using an appropriate sensing configuration with ADCs 24 and 26 for simultaneously capturing current and voltage samples, a computing device 28 can make a running compilation of these samples over time and compute the energy dissipation over the entire period 46. An appropriate correction signal 30 can then be generated and applied to the semiconductor drive device 16 to reduce this energy dissipation, and thus its heating effects, preferably via shortening or extending the $T_{off}$ time period 44.

Additionally, since a computing device 28 would preferably be employed for calculation and correction signal generation, additional environmental sensors that record influential ancillary parameters, such as ambient temperature, airflow, input, and output conditions could be used and monitored by that computing device 28. This capability can be important in certain applications, since all of these parameters affect energy/heating accumulations and dispersions. For example, at higher ambient temperatures or low circulating air flow, less heat can be dissipated by the heat sinking of the switching device, and to prevent junction temperatures from reaching unacceptable levels, the power dissipation must be reduced to a lower operating level.

Figure 3:
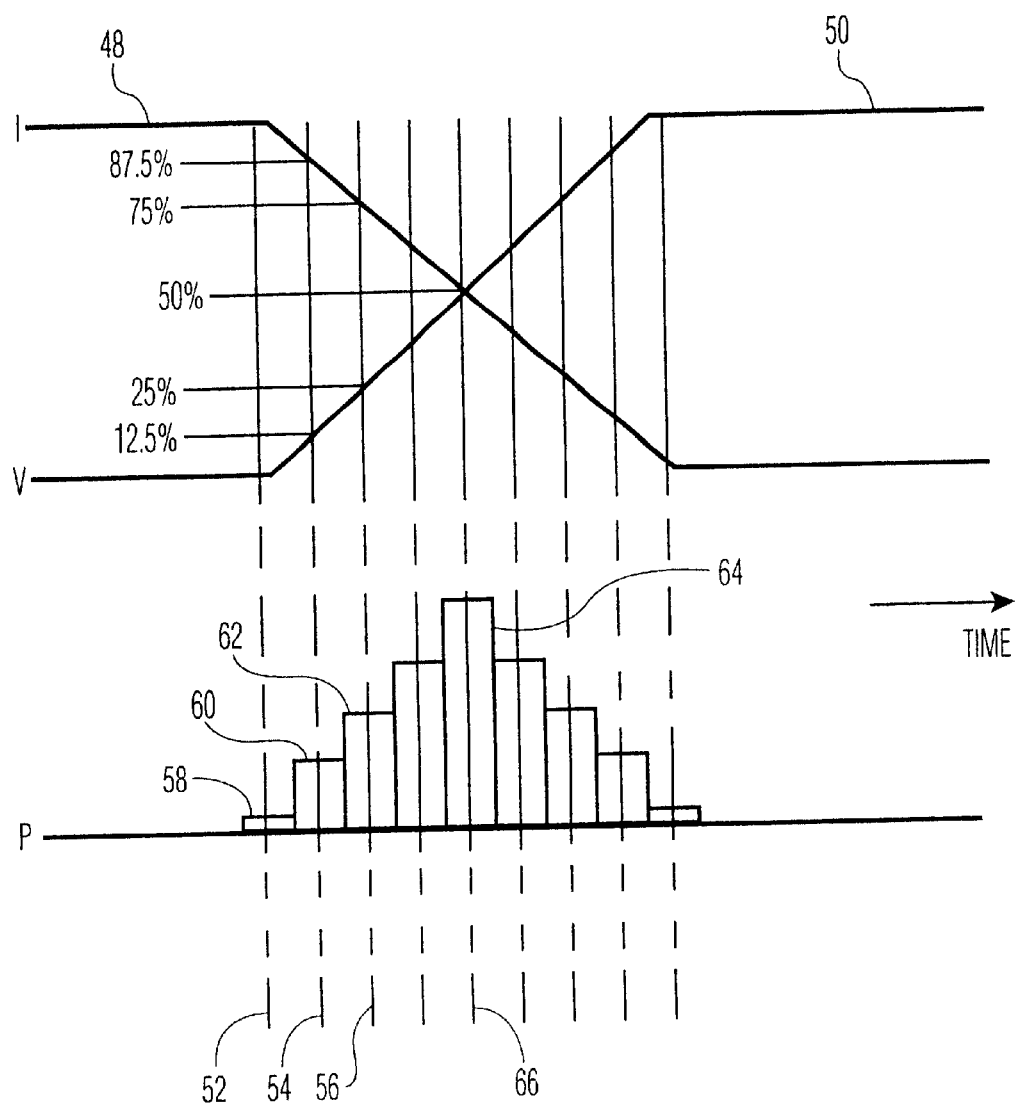
FIG. 3 shows a detailed view of exemplary switching losses at a device turn off time period having individual sampling strobe times.

FIG. 3 shows an illustration of exemplary switching losses at a device turn off time period at selected sampling strobe times. Energy dissipation during such transitions will always be the area under a voltage-current product waveform. For example, current waveform 48 and voltage waveform 50 are multiplied at each sample time 52, 54, 56, etc. Assuming a finite number of samples during the transition time being measured, a piece-wise linear approximation will produce a unique sequence of rectangular areas 58, 60, 62, respectively, each of which represent a power amplitude that is maintained for the time duration between the samples. An exemplary energy calculation using normalized voltage, $V_{max}$, and current, $I_{max}$, could be $V \times I = (1\% \, V_{max}) \times (100\% \, I_{max})$, or $0.01 \, V_{max} I_{max}$ for rectangle 58 at strobe time 52, $(12.5\% \, V_{max}) \times (88.5\% \, I_{max})$, or $0.11 \, V_{max} I_{max}$ for rectangle 60 at strobe time 54, $25\% \, V_{max} \times 75\% \, I_{max}$, or $0.19 \, V_{max} I_{max}$ for rectangle 62 at strobe time 56, etc.

Summing the rectangle areas gives the total energy dissipated between the beginning and end of the transition time period. This energy dissipation is then averaged over an entire period 46 to give the average power dissipation for this switching component that is governed by the equation $$P_{ave} = (1/T) \Sigma V_t I_t \Delta t \quad [1]$$

where $P_{ave}$ is the average power dissipated in semiconductor driving device 14 due to this transition component, T is the period associated with a single cycle of operation, $V_t$ and $I_t$ are the instantaneous values of voltage and current measured at each sampling time t, and $\Delta t$ is the sampling time interval.

An identical equation applies to all time intervals in the period, and a resulting average power dissipation is the sum of the individual average power dissipations, or $$P_{ave} = P_{turn-on} + P_{on} + P_{turn-off} + P_{off} \quad [2]$$

where the individual terms are the average power dissipations associated with the transitions from off-to-on and on-to-off of drive device 14 as well as the quiescent on and off times. The time period T 46 is the sum of the time intervals associated with powers shown in equation 2, or $$T = T_{turn-on} + T_{on} + T_{turn-off} + T_{off} \quad [3]$$

It is recognized that the increase in period 46 decreases the operating frequency of the system and causes proportional impedance changes in any reactive elements. Further, to maintain a specific power output, an increase in $T_{on}$ 42 is required to provide the additional charge needed to sustain a load over the increased period 46. Although on time 42 this is typically characterized by high currents at low voltage and producing lower average power dissipation in semiconductor switching device 14 by reducing the losses from the switching transients times 36 and 40, alternative configurations can provide an opposite effect where the quiescent "on" condition is the higher power contributor to average power. The specific algorithm or method employed in the application must incorporate the effects of all such stimuli and associative relationships.

Figure 4:
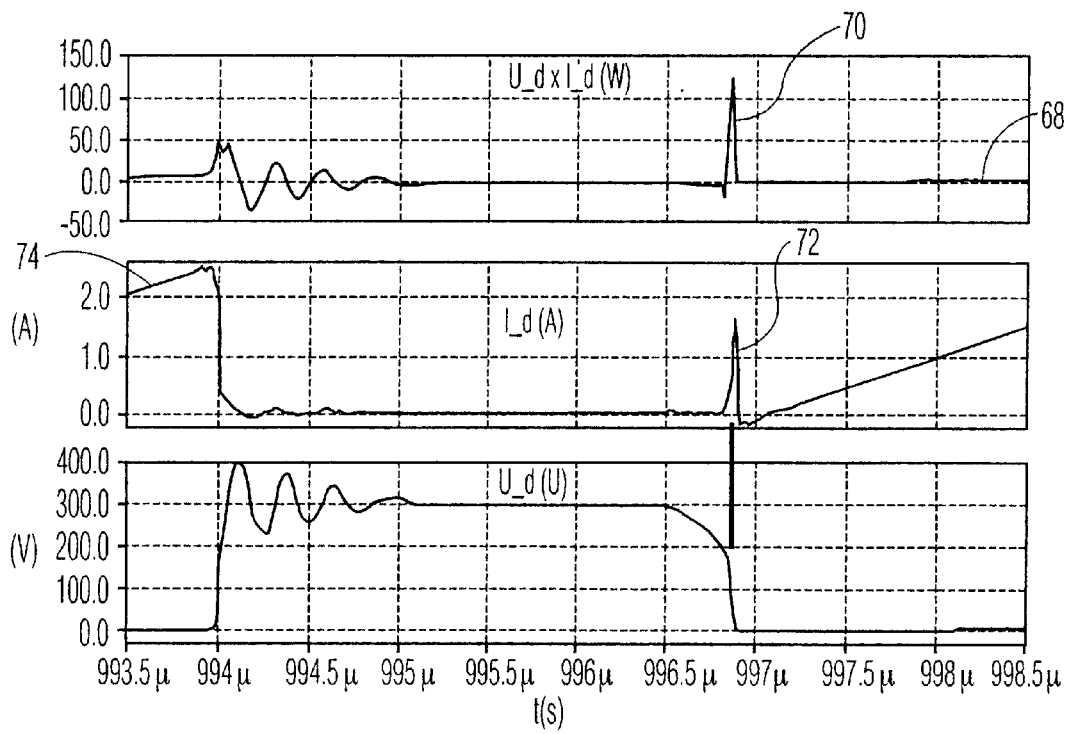
FIGS. 4 through 6 show the voltage and current waveforms shown in FIG. 2 under different times for $t_{off}$.
Figure 5:
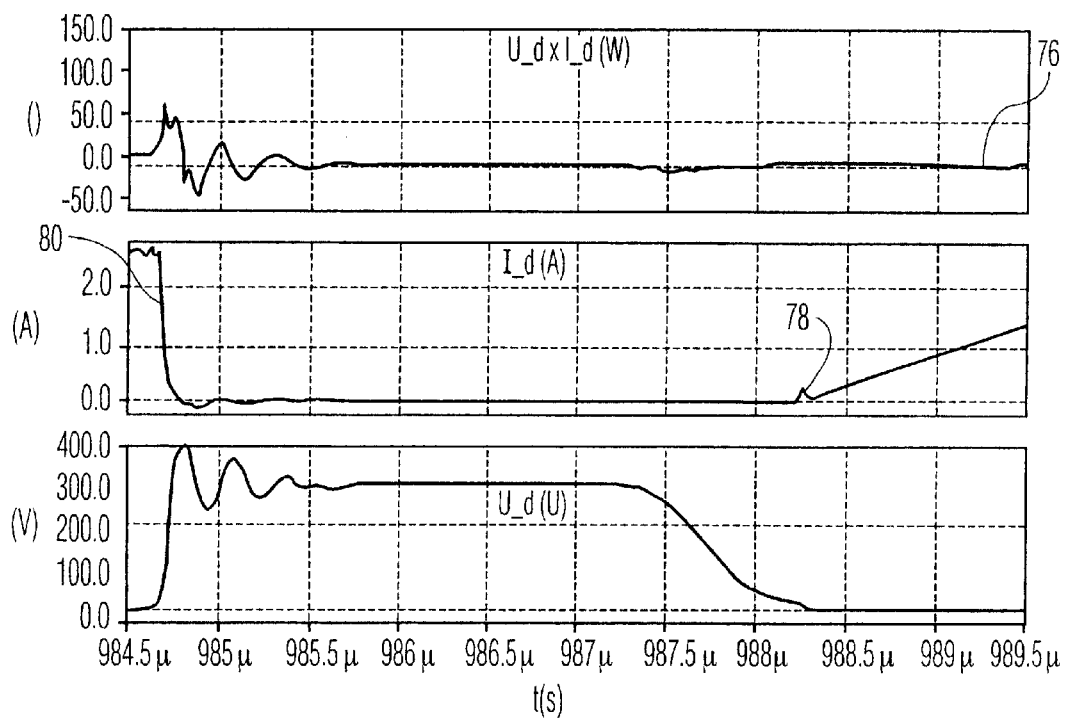
Figure 6:
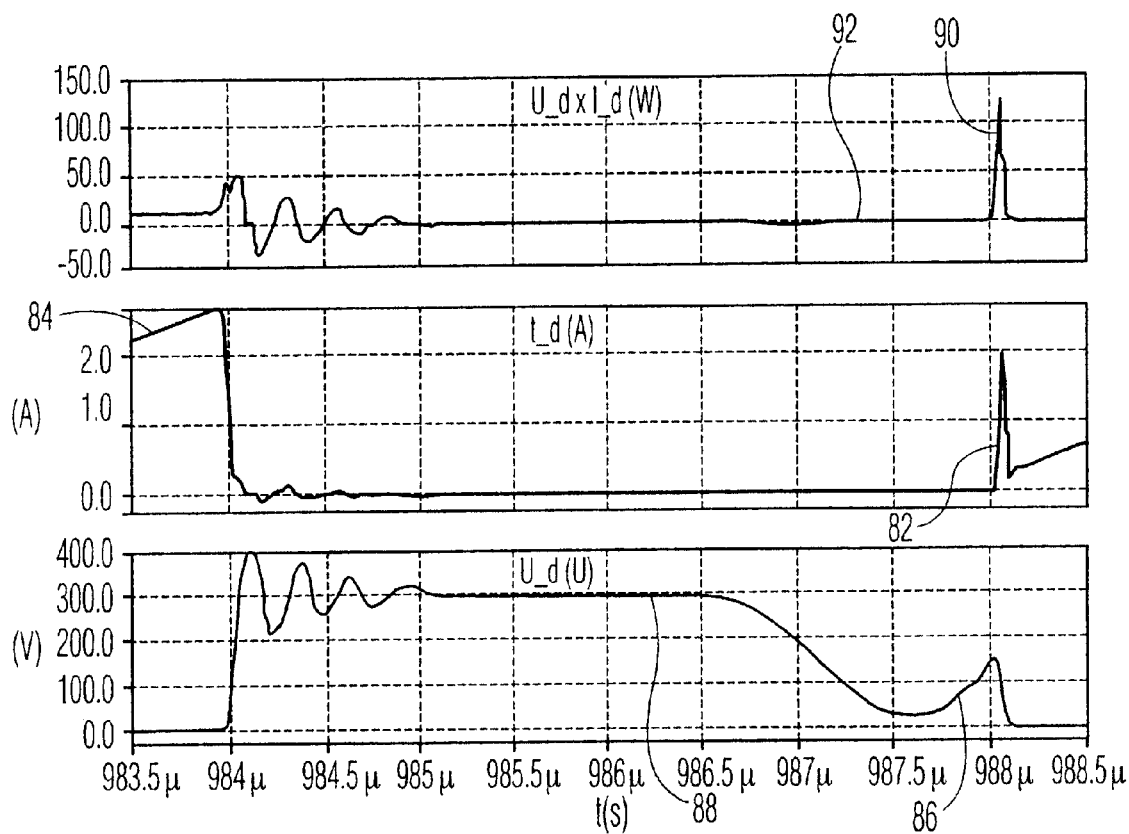

To provide a better understanding of the effects of adjusting $t_{off}$ time 44, FIGS. 4 through 6 show the voltage and current waveforms shown in FIG. 2 under different times for $t_{off}$ 44.

In FIG. 4, a representative $t_{off}$ 44 of 2.9 microseconds shows a calculated power signal 58 having a transient pulse 70 resulting from a parasitic current pulse 72 in current signal 74 during a time of non-zero voltage. To compensate for this detected power component, correction signal exemplarily increases $t_{off}$ 44 to 3.58 microseconds as shown in FIG. 5. The current spike is greatly reduced as shown by the absence of a transient power pulse in power signal 76, due to a reduced current pulse 78 in current signal 80.

Consider, further increases in $t_{off}$ 44 to a representative 4.11 microseconds as shown in FIG. 6, which, if uncorrected, can enable a parasitic current spike 82 on current signal 84 to appear coincident with an exemplary parasitic ringing 86 of voltage waveform 88. This results in a power dissipation transient 90 in calculated power signal 92. This increased power is exaggerated for instructional purposes, since correction signal 30 would have sensed a worsening power dissipation calculation and made corresponding adjustments in $t_{off}$ 44 before high power transient condition 90 occurred.

Although the above discussion discloses a method for a power switching device that impresses a voltage across an inductive element, a corollary description could describe a current switching device driving a capacitive load and such embodiment is intended to be within the scope of the present invention.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the embodiments may be varied without departing from the spirit of the invention, and the exclusive use of all modifications which come within the scope of the appended claims is reserved.

What is claimed is:

1. An apparatus for minimizing switching losses in a power device in power converter circuits comprising:
    a switching control means for driving said power device;
    a first measuring means for instantaneously measuring at a plurality of predetermined times an associated plurality of voltage signals being impressed across the terminals of said power device;
    a second measuring means for sampling at the same predetermined times an associated plurality of current signals conducting through said power device;
    a third measuring means for metering time;
    a storage means for holding a control program, predetermined reference signals, and the aforementioned measured signals;
    a computing means for calculating energy loss using said sampled voltage current, and time; and
    a correction means for adjusting said energy loss using said stored signals.

2. The apparatus according to claim 1, wherein the switching control means comprises a circuit for activating and deactivating said power device.

3. The apparatus according to claim 1, wherein the first and second measuring means each comprise a comparator circuit for obtaining a plurality of signals representing said voltages and currents, respectively, at the plurality of predetermined times.

4. The apparatus according to claim 3, wherein each sampling circuit comprises an analog-to-digital converter.

5. The apparatus according to claim 1, wherein the storage means comprises at least one from the group comprising dynamic RAM, static RAM, and electronically programmable memory.

6. The apparatus according to claim 1, wherein the storage means comprises volatile and non-volatile memory devices.

7. The apparatus according to claim 1, wherein the computing means comprises at least one from the group consisting of microprocessor, micro-controller, digital signal processor, and personal computer.

8. The apparatus according to claim 7, wherein the computing means additionally comprises an algorithm for calculating the energy loss.

9. The apparatus according to claim 7, wherein the computing means additionally comprises at least one look-up table having reference signal values retained in said storage means.

10. The apparatus according to claim 1, wherein the correction means comprises an electronic switch, which terminates an "On" condition at a predetermined time.

11. A method for minimizing switching losses in power control circuits, comprising the steps of:
   a) strobing at a predetermined time at least a pair of sampling unit to obtained a first and second measurement signal, representing the amplitude of a voltage and a current, respectively, that are associated with a switching device;
   b) transmitting said measurement signals to a computing device; and/or
   c) temporarily storing said measurement signals in a storage means;
   d) repeating step a) through c) at a plurality of predetermined times to create a plurality of measurement signals;
   e) calculating a power signal from the plurality of measurement signals using a processing means; and
   f) creating a correction signal for adjusting said switching losses.

12. The method according to claim 11, wherein each comparator comprises an analog-to-digital converter.

13. The method according to claim 11, wherein the storage means comprises at least one from the group comprising dynamic RAM, static RAM, and electronically programmable memory.

14. The method according to claim 11, wherein the storage means comprises volatile and non-volatile memory devices.

15. The method according to claim 11, wherein the computing means comprises at least one from the group consisting of microprocessor, micro-controller, and digital signal processor, and personal computer.

16. The method according to claim 11, wherein the processing means comprises an algorithm for calculating the energy loss.

17. The method according to claim 11, wherein the processing means comprises look-up table having reference signal values retained in said storage means.

18. The method according to claim 11, wherein the correction signal comprises a change in a $T_{off}$ time.

19. The method according to claim 11, wherein the correction signal comprises a change in the operating frequency of said power control circuits.

* * * * *